United States Patent [19]
Benham

[11] Patent Number: 5,297,869
[45] Date of Patent: Mar. 29, 1994

[54] APPARATUS AND METHOD FOR SYNCHRONISING A DIGITAL DATA CLOCK IN A RECEIVER WITH A DIGITAL DATA CLOCK IN A TRANSMITTER

[75] Inventor: Simon Benham, Reading, England

[73] Assignee: Research Machines PLC, Oxford, England

[21] Appl. No.: 858,344

[22] Filed: Mar. 26, 1992

[51] Int. Cl.$^5$ .......................... H03D 3/24; H04L 7/00
[52] U.S. Cl. ..................... 375/110; 375/120; 328/155; 307/511
[58] Field of Search ............... 375/110, 120; 328/139, 328/155; 307/511; 341/68

[56] References Cited

U.S. PATENT DOCUMENTS 4,984,255  1/1991  Davis et al. .................... 375/110

FOREIGN PATENT DOCUMENTS 0200370  5/1986  European Pat. Off. .
0262609  4/1988  European Pat. Off. .
0360691  3/1990  European Pat. Off. .

*Primary Examiner*—Curtis Kuntz
*Assistant Examiner*—Tesfaldet Bocure
*Attorney, Agent, or Firm*—Ladas & Parry

[57] ABSTRACT

A receiving apparatus for synchronising a digital data clock in a receiver with a digital data clock in a transmitter and a method therefor is disclosed which utilizes two phase-locked loops so as to improve accuracy and jitter performance. One of the phase-locked loops is locked onto positive edges in a received waveform and the other phase-locked loop is locked onto negative edges. The phase-locked loops independently decode the 1's and 0's in the data allowing the transmit data and clock to be readily recovered. Each of the phase-locked loops uses a decoding method in which mid-bit transitions in the encoded received waveform are detected in more than half of the sampling periods within one bit period which further improves the performance of the apparatus.

11 Claims, 5 Drawing Sheets

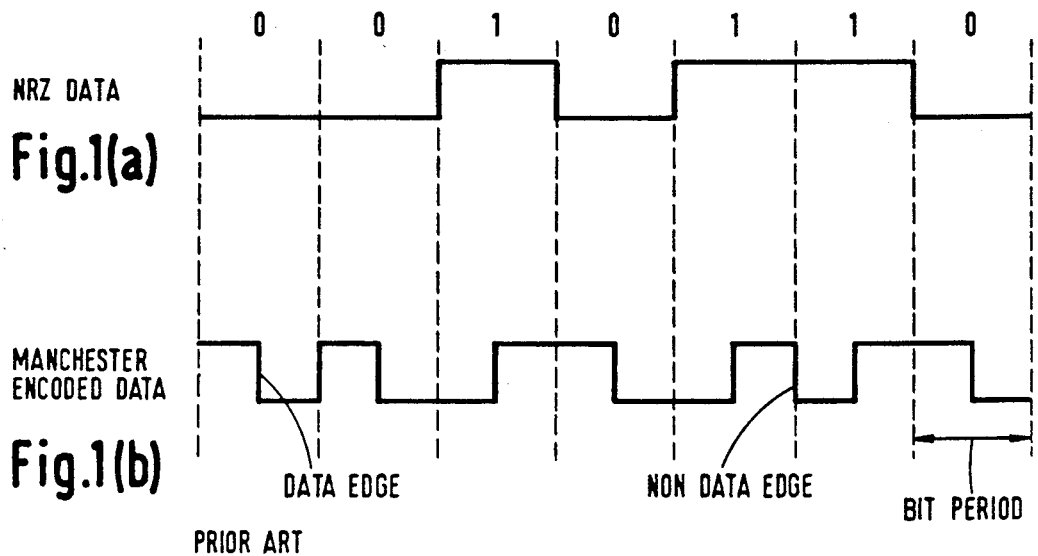
Fig.1(a) NRZ DATA
Fig.1(b) MANCHESTER ENCODED DATA
DATA EDGE  NON DATA EDGE  BIT PERIOD
PRIOR ART
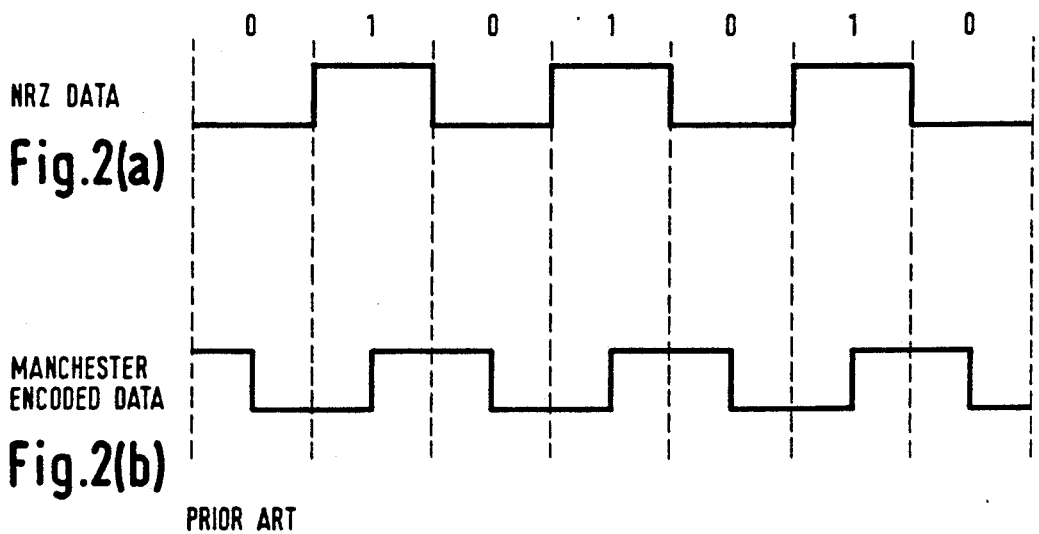
Fig.2(a) NRZ DATA
Fig.2(b) MANCHESTER ENCODED DATA
PRIOR ART

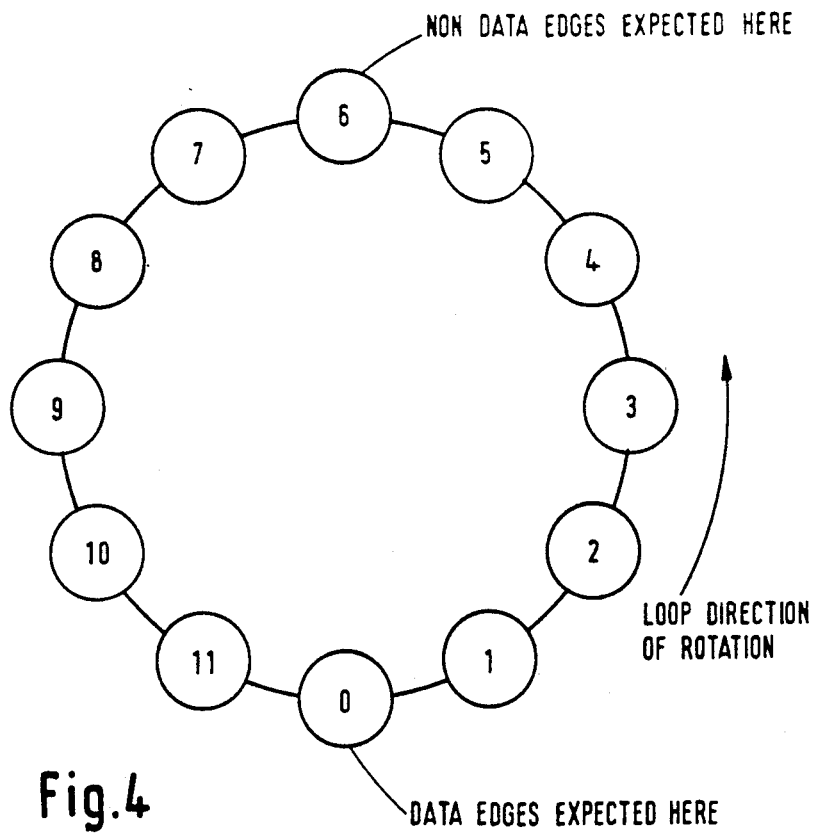
Fig.4
MANCHESTER
ENCODED DATA
Fig.5(a)
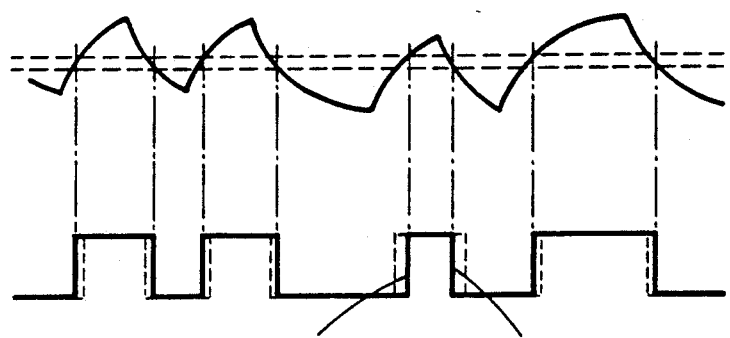
CABLE WAVEFORM
Fig.5(b)
DIGITISED
CABLE WAVEFORM
Fig.5(c)

APPARATUS AND METHOD FOR SYNCHRONISING A DIGITAL DATA CLOCK IN A RECEIVER WITH A DIGITAL DATA CLOCK IN A TRANSMITTER

BACKGROUND OF THE INVENTION a) Field of the Invention

This invention relates to a receiving apparatus and a method therefor for synchronising a digital data clock in a receiver with a digital data clock in a transmitter.

b) Description of the Prior Art

It is known in digital electronic systems to send digital data from one device (a transmitter) to another device (the receiver). In many such systems a single cable is used as the transmission media between the two devices in which the data is converted into individual binary digits (bits) of information which are serially transmitted along the cable.

Some form of encoding is required to represent each of the bits of data to be transmitted and one common form of encoding is the so-called "no return to zero" (NRZ) of which an exemplary waveform is shown in FIG. 1(a). Referring to FIG. 1(a) each data bit has one of two values which are represented by high and low voltage levels on the cable, the low voltage levels being represented by data level "0" and the high voltage levels being represented by data level "1". To correctly decode the data it is necessary for the receiver to know at what point to sample the incoming waveform. In instances where the transmitter and receiver share a common clock then synchronisation is relatively straightforward but it is not usually the case that the transmitter and receiver share a common clock and so it then becomes necessary for the receiver to generate its own clock with which it samples the incoming data. Although this may not represent any problems for short data streams, there will invariably be problems with frequency variations between the transmitter and receiver clocks, particularly if the data stream contains long periods of one particular logic level which give the receiver no information about the clock of the transmitter.

It is, therefore, desirable to transmit the data and the clock used to generate it. One known encoding method used to enable the clock and data to be sent down a single cable is so-called "Manchester" encoding, a typical waveform of which is shown in FIG. 1(b) corresponding to the NRZ data waveform shown in FIG. 1(a). It will be noted that from FIG. 1(b) that each data bit is split into two halves, the first half of each bit period being set equal to the inverse of the data bit to be sent and the second half being set equal to the data bit to be sent. The relevant and important feature of the waveform of FIG. 1(b) is that there is a transition in the middle of every bit period regardless of the data which is being sent.

At the start of data transmission a preamble of alternating 0's and 1's is transmitted and such a preamble waveform for the NRZ data is shown in FIG. 2(a) and for the Manchester encoded data is shown in FIG. 2(b). The Manchester encoded data preamble waveform, as shown in FIG. 2(b), only has transitions in the middle of every bit period and not at the end of the bit periods, and it is a square wave at exactly half the frequency of the transmitted NRZ data rate shown in FIG. 2(a). The receiver is, thus, able to use the preamble to synchronise its own clock and the ensuing transition in the middle of every bit period is used to maintain the synchronisation.

It is known to use a phase-locked loop (PLL) to perform the receiver clock synchronisation and in a conventional receiver the Manchester encoded data is decoded by using the receiver clock to sample the incoming data. Thus, to correctly decode the data the receiver clock must match the transmitter clock to within a quarter of a bit period or the data may be sampled on the wrong side of a transition in the data. The receiver must also be able to cope with jitter in the incoming data stream, that is in which the individual edges of the waveform may be shifted by a significant amount from their normal position. Thus, to take ETHERNET as an example, the bit period is 100 ns and so the receiver clock must be accurate to ±25 ns. It is also possible to have jitter of up to 18 ns—as specified in ISO Standard 8802.3—which means that, as an absolute minimum, the accuracy of the receiver clock must be ±7 ns.

Until relatively recently the majority of high-speed phase-locked loops were analogue in nature and these had the advantage of having an infinite resolution but required the use of accurate capacitors and resistors which makes them unsuitable for integration into digital integrated circuits.

A digital phase-locked loop requires no such precision components. However, its resolution is very much limited by its sampling frequency. Therefore, to take the example of ETHERNET, if it was decided that a clock accuracy of ±5 ns was required, this would require a 200 MHz sampling rate in a conventional digital phase locked loop. This is above the maximum clock frequency achievable in most current silicon technologies.

It is an object of the present invention to provide a receiving apparatus for synchronising a digital data clock in a receiver with a digital data clock in a transmitter and to provide a method therefor.

SUMMARY OF THE INVENTION

According to one aspect of this invention there is provided a receiving apparatus for synchronising a digital data clock in a receiver with a digital data clock in a transmitter, said receiver being adapted to receive encoded data formed by a plurality of bits, each said bit having a predetermined period, said receiver including means for detecting positive and negative going edges of said encoded data and to provide positive and negative edge detection signals indicative thereof, a first phase locked loop adapted to receive said positive edge detection signals, a second phase locked loop adapted to receive said negative edge detection signals, said first and second phase locked loops including means for determining whether an edge is in substantially the middle of a bit period indicative of a data edge or an edge at the end of a bit period indicative of a non-data edge, and clock and data recovery means connected to receive output signals from said first and second phase locked loops, said recovery means being adapted to reproduce said transmitted data bits in dependence upon the outputs from the first and second phase locked loops, whereby an output from said first phase locked loop indicates to said recovery means a logical "1" was transmitted and an output from said second phase locked loop indicates to said recovery means a logical "0" was transmitted.

According to a further aspect of this invention there is provided a method of synchronising a digital data clock in a receiver with a digital data clock in a transmitter, said receiver being adapted to receive encoded data formed by a plurality of bits, each said bit having a predetermined period, said receiver operation including the steps of detecting positive and negative going edges of the received encoded data and providing positive and negative edge detection signals indicative thereof, receiving said positive edge detection signals in a first phase locked loop, receiving said negative edge detection signals in a second phase locked loop, said first and second phase locked loops determining whether an edge is in substantially the middle of a bit period indicative of a data edge or an edge at the end of a bit period indicative of a non-data edge, and recovering output signals from said first and second phase locked loops to reproduce said transmitted data bits in dependence upon the outputs of each of the first and second phase locked loops whereby an output from said first phase locked loop indicates a logical "1" was transmitted and an output from said second phase locked loop indicates a logical "0" was transmitted.

Preferably, said received data comprises encoded data with a period of one half the bit period of transmitted data and an expected data edge at approximately the middle of each transmitted data period and each phase locked loop has a counter means for maintaining lock on said data such that when a data or a non-data edge occurs the phase locked loop compares the actual edge position with the expected position of the edge and if the edge is later than expected the counter associated with said phase locked loop is incremented and if the edge is earlier than expected the counter associated with said phase locked loop is decremented.

Advantageously, if the count of the counter means reaches a predetermined maximum value or a predetermined minimum value, then the sampling period where data and non-data edges are expected is advanced or retarded respectively by one sample.

Conveniently, when a data edge is detected by one of the first and second phase locked loops then a disable signal is sent to the other of said first and second phase locked loops to prevent said other of said first and second phase locked loops detecting a data edge.

Normally, the received encoded data includes a preamble portion of data bits and, advantageously, the first and second phase locked loops are arranged to ignore a first predetermined number of bits of said preamble portion, said predetermined number of bits being dependent upon when the received signal jitter is substantially constant.

Advantageously, the preamble portion of data bits of the received data is such that every edge is a data edge and means are provided for sampling each said bit at a predetermined rate after detecting said data edge.

Preferably, the number of samples n is four or a multiple thereof, and at sampling periods n/4 and 3n/4 if an edge is detected as a data edge by one of the first and second phase locked loops then a data valid signal is sent from the detecting phase locked loop to the clock and data recovery means but no change is made to the count of the detecting phase locked loop counter means, and a data disable signal is transmitted from the detecting phase locked loop to the other phase locked loop for preventing said other phase locked loop from generating a data valid signal for a predetermined number of sampling periods.

In a currently preferred embodiment, the clock and data recovery means recovers the data signal using a set/reset arrangement in which the data valid signal from the positive edge triggered phase locked loop sets the decoded data signal and the data valid signal from the negative edge triggered phase locked loop resets the decoded data signal whereby NRZ received data is produced. Additionally, advantageously, the clock and data recovery means recovers the clock data by detecting whenever one of the data valid signals becomes active, whereby the clock signal is set active at a predetermined time after the change in the NRZ data and thereafter the clock signal is set inactive ready for the next time one of the data valid signals goes active, whereby the active edges in the clock signal are used to sample the decoded data.

The apparatus and method of this invention is designed to be operable in particular with Manchester encoded data.

BRIEF DESCRIPTION OF THE DRAWINGS

The invention will now be described, by way of example, with reference to the accompanying drawings in which:

FIG. 1(a) shows received non-return to zero (NRZ) data,

FIG. 1(b) shows a waveform of received Manchester encoded data,

FIG. 2(a) shows a preamble waveform of NRZ data,

FIG. 2(b) shows a preamble of Manchester encoded data,

FIG. 4 shows in schematic form sampling periods within one bit period as used in this invention, FIG. 5(a) shows a Manchester encoded data waveform, FIG. 5(b) shows the Manchester encoded data as a practical waveform on a cable in which jitter is present, FIG. 5(c) shows the digitized form of the cable waveform.

In the figures, like reference numerals denote like parts.

DESCRIPTION OF THE PREFERRED EMBODIMENTS

Figure 3:
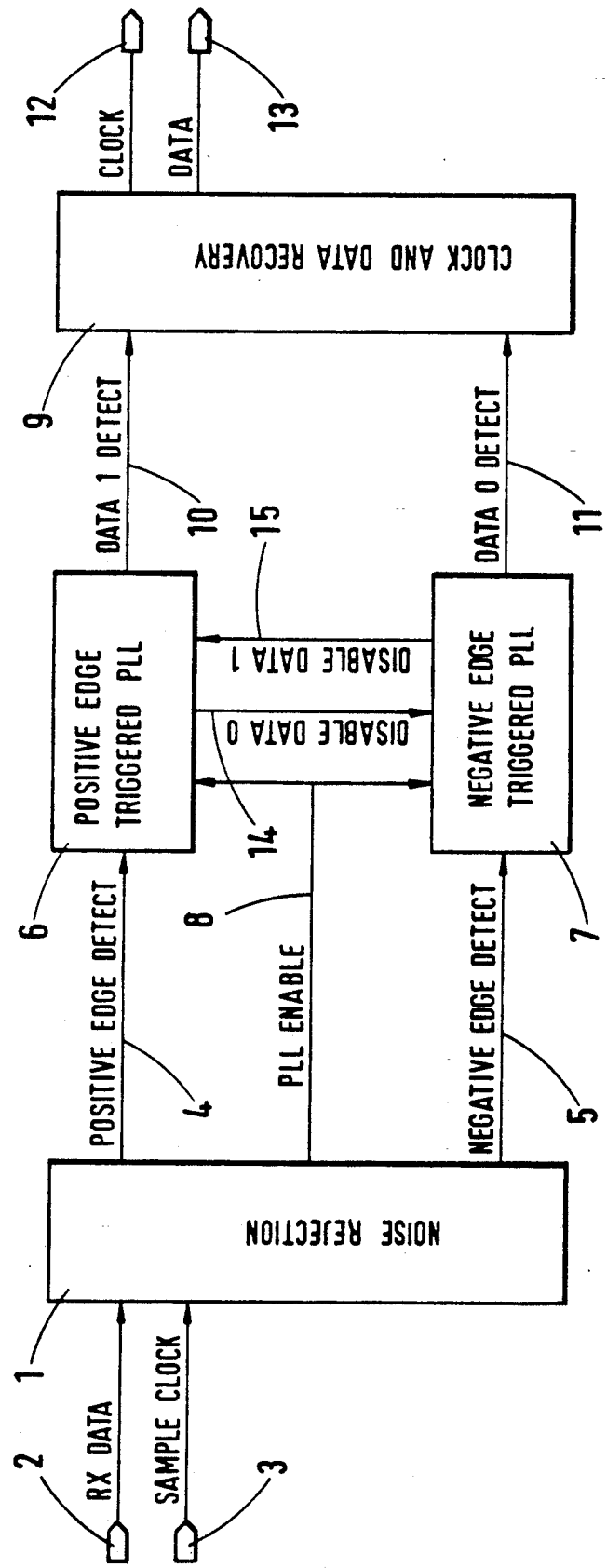
FIG. 3 shows a simplified block schematic diagram of an apparatus in accordance with this invention.

The receiving apparatus for synchronising a digital data clock signal in a receiver is shown in simplified block schematic form in FIG. 3 and has a noise rejection circuit 1 adapted to receive transmitted Manchester encoded data, on a receive data input 2, and a clock terminal 3 with which to sample, i.e. digitize, the data. The receive data is sampled to produce two signals, one of which indicates that a positive edge was detected in the sampling period (positive edge data detect) which is output on line 4 and the other to indicate that a negative edge was detected (negative edge data detect) which is output on line 5, the line 4 being connected to a positive edge triggered phase-locked loop 6 and the line 5 being connected to a negative edge triggered phase-locked loop 7. The noise rejection circuit is also arranged to detect when valid data is present on the receive data input line and controls the enabling and disabling of the phase-locked loops 6 and 7 via an enable/disenable line 8.

In a conventional phase-locked loop a fast lock circuit is employed which ensures that it can quickly lock onto an incoming waveform. To reduce the amount of circuitry required, the present invention makes use of the fact that, after the first few bits of preamble in the receive waveform, the position of the edges in the waveform will have stabilized and the jitter will be substantially constant. Thus, if enabling of the phase-locked loops is delayed until a fixed number of bits after a valid receive waveform has been detected by the noise reject circuit 1, the phase-locked loops 6, 7 will lock onto a stable waveform and so have no need for a fast lock circuit. However, for the sake of completeness, the implementation of a fast lock circuit which may be used with the phase-locked loops of this invention will be described later herein.

Thus, the phase-locked loops 6, 7 each receive two signals from the noise reject circuit 1, a phase-locked loop enable signal supplied over line 8 which is common to both of the phase-locked loops and either a positive or negative edge detect signal over line 4 or 5 respectively. When one of the phase-locked loops is disabled it is in an idle state and a counter associated therewith is set to an intermediate (normally median) value.

If a phase-locked loop has been disabled and is then enabled, it will remain in the idle state until its edge detect signal goes active and will then make the assumption that this edge represents the correct sampling period in which to detect a data edge. The activated phase-locked loop will then begin to rotate around a sampling loop, as shown in FIG. 4, in which the bit period is split into a number of sampling periods, denoted by numbers 0 to 11. Although the example shown in FIG. 4 has the bit periods split into twelve sampling periods, the actual number will depend upon the relationship between the bit period and the sampling frequency, although the phase-locked loops will usually have an even number of samples in one bit period. Advantageously, if the number of samples n is four or a multiple thereof, at sampling periods n/4 and 3n/4 if an edge is detected as a data edge by one of the phase-locked loops, then a data valid signal is sent from the detecting phase-locked loop to a clock and data recovery circuit 9, whereby a data level "1" detected by phase-locked loop 6 is transmitted to circuit 9 over line 10 and a data level "0" is transmitted to the circuit 9 over line 11.

In the FIG. 4, the sample period in which the first edge is seen is numbered 0 and the phase-locked loop performing the sampling will expect to see data edges in sample 0 and non-data edges in sample 6. If an edge occurs in sample 1, the phase-locked loop would assume that this was a data edge, but shifted backwards by one sampling period from its nominal position. The phase-locked loop data detect line will then go active to indicate to the clock and data recovery circuit 9 that a data edge has occurred and the phase-locked loop counter will be incremented to record that the data edge was after its expected position. Similarly, an edge in sample 2 will be interpreted as a data edge but shifted further from its expected position and the data detect line will go active and the counter will be incremented. The value by which the counter is incremented may be the same as for an edge in sample 1 or, advantageously, could be larger to reflect the fact that the edge wa further from its expected position.

Similar provisions apply for edges detected in samples 10 and 11 except that the counter will be decremented. The amount subtracted in samples 11 and 10 respectively should be the same as those added in samples 1 and 2 respectively.

Non-data edges are treated in exactly the same manner, with the counter being incremented for edges ahead of their expected position, e.g. samples 7 and 8, and decremented for those lagging their expected position, e.g. samples 4 and 5. However, any non-data edges detected will not set the data detect line active.

If edges are consistently displaced from their expected position in the same direction, i.e. a majority of the edges are earlier or later than expected, then the counter value will eventually reach a minimum or maximum value in dependence upon the difference in frequency between the transmit clock and the receiver sampling clock. Once this value is reached then the sampling periods in which data and non-data edges are expected will be either advanced or retarded by one sampling period, thus maintaining lock on the incoming data waveform. The counter is also reset back to its intermediate (usually median) value and the whole process repeats. The positive and negative edged triggered phase-locked loops will continue to maintain lock in this fashion until the noise reject circuit 9 detects the end of the data packet that has been received and disables the phase-locked loops. The circuit 9 thus provides clock pulses for sampling the synchronised data to terminal 12 and synchronised data to terminal 13.

Although, for convenience, the counter is reset to a median value, so as to more closely simulate an analogue phase-locked loop, the counter may be set to a value close to the limit opposite the one which caused the counter to be reset, that is if the counter has reached its predefined maximum value then it should be reset to a value close to the minimum counter value. Such resetting is so that the counter value gives a representation of the nominal edge position within a sample period and so the counter being reset close to the opposite limit indicates the nominal edge position that has just crossed a sampling period boundary.

From FIG. 4 it will be noted that there are two sampling periods in which neither data nor non-data edges are detected, that is samples 3 and 9. It is to be noted that this will only be the situation if the number of samples in one bit period is a multiple of four, i.e. it is true for twelve samples in one bit period but not for ten or fourteen. These two sampling periods can be used to further increase the accuracy of the phase-locked loop by considering the waveform which appears at the noise rejection circuit 1. In this respect, because the cable between the transmitter and receiver acts as a low pass filter, a signal which appears at the noise rejection circuit may look very different to that which was transmitted. FIG. 5(a)-5(c) demonstrates this fact showing possible examples of transmitted and received waveforms. Thus, the transmitted waveform of Manchester encoded data shown in FIG. 5(a), when applied to the interconnecting cable between transmitter and receiver, adopts the waveform shown in FIG. 5(b) in which the top broken line denotes logic threshold level "1" and the bottom broken line denotes logic threshold level "0". The waveform of FIG. 5(c) denotes the digitized cable waveform in which the nominal edge positions are shown by broken lines. From the waveforms of FIGS. 5(a)-5(c) it can be seen that jitter has been introduced to the edges of the received waveform (FIG. 5(c)).

Investigation reveals that the way in which an edge can be jittered the most from its nominal or expected position is where a short high (1) or low (0) on the cable is followed by a long low or high, respectively, and then by a short high or low respectively and this feature will be observed from FIGS. 5(b) and 5(c). The edge A at the end of the long pulse is significantly later than its nominal position, while the edge B at the end of the following short pulse is earlier than its nominal position. It is these two edges which are most likely to end up in the sampling period in which neither data nor non-data edges are detected. Examination of the waveform reveals that edge A is always a data edge and that edge B is always a non-data edge. Therefore, a method is employed in which any edge in one of the two unused sampling periods 3 and 9 in FIG. 4 is detected as a data edge and sets the data detect signal but then makes no change to the phase-locked loop count. To then prevent edge B from generating a data detect signal from the other phase-locked loop, the detecting phase-locked loop sends out a data disable signal over line 14 or 15 in dependence upon which of the phase-locked loops detect the data edge, to prevent the non-detecting phase-locked loop from generating a data valid signal for a predetermined number of periods, for example two sampling periods. Thus, although both edges may have occurred in the unused sampling period, only the first edge will generate a valid data signal to the clock and data recovery circuit 9.

In the currently described embodiment of the invention a double sampling technique is employed in which the input data is sampled on both edges of the sampling clock. The phase-locked loops then accept, as inputs on lines 4 and 5 respectively, two bits, one of which indicates that there was an edge of the correct polarity for the particular phase-locked loop 6 or 7 in the first half of the sampling clock period (20–30 in FIGS. 6(a) and 6(b)) and the other bit indicating that there was an edge in the second half of the sample clock period (10–20). Thus, each phase-locked loop consists of two loops with the expected edge position of the data separated by half a system clock.

Figure 6A:
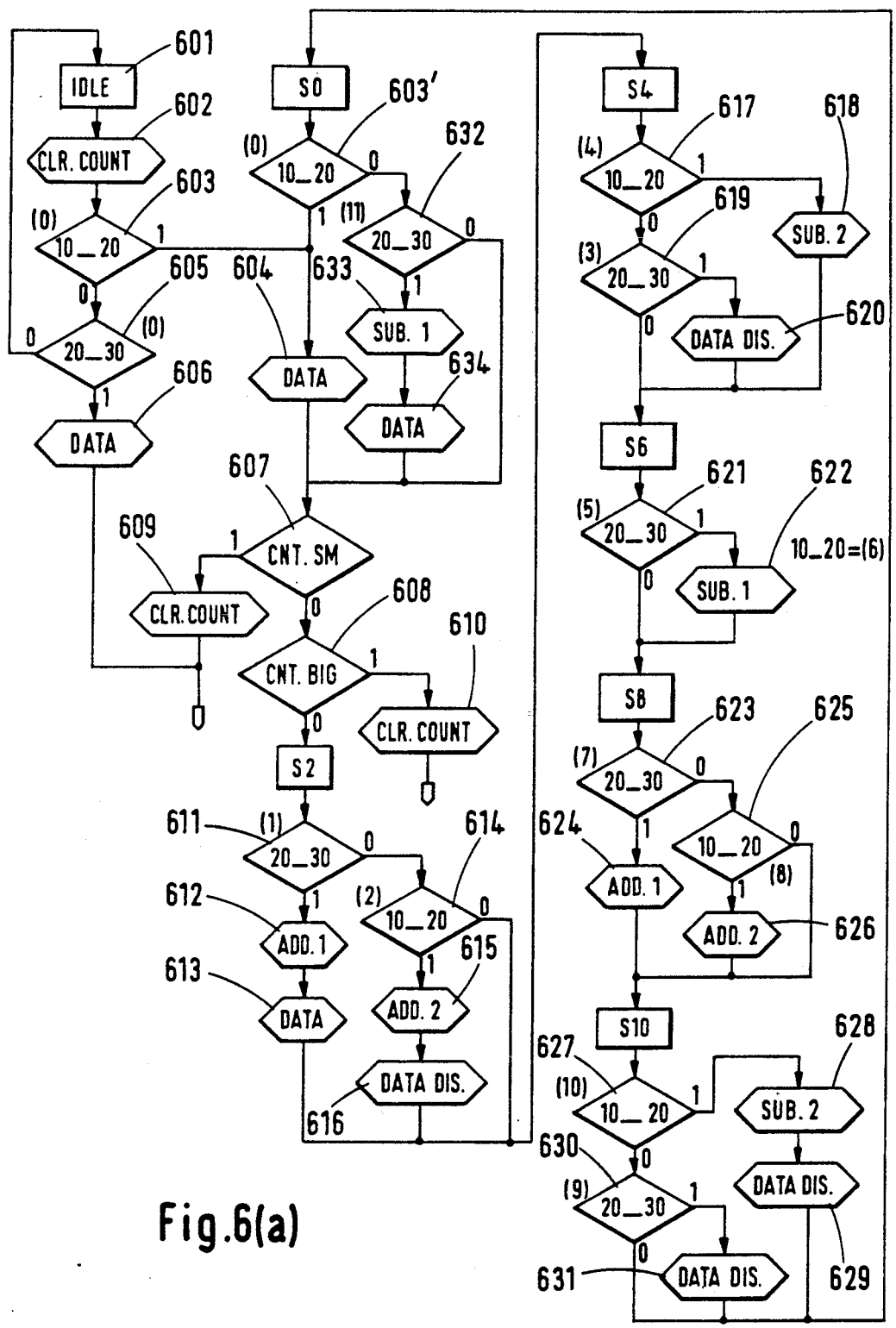
FIGS. 6(a) and 6(b) show the state machine diagram for each of the phase-locked loops of this invention.
Figure 6B:
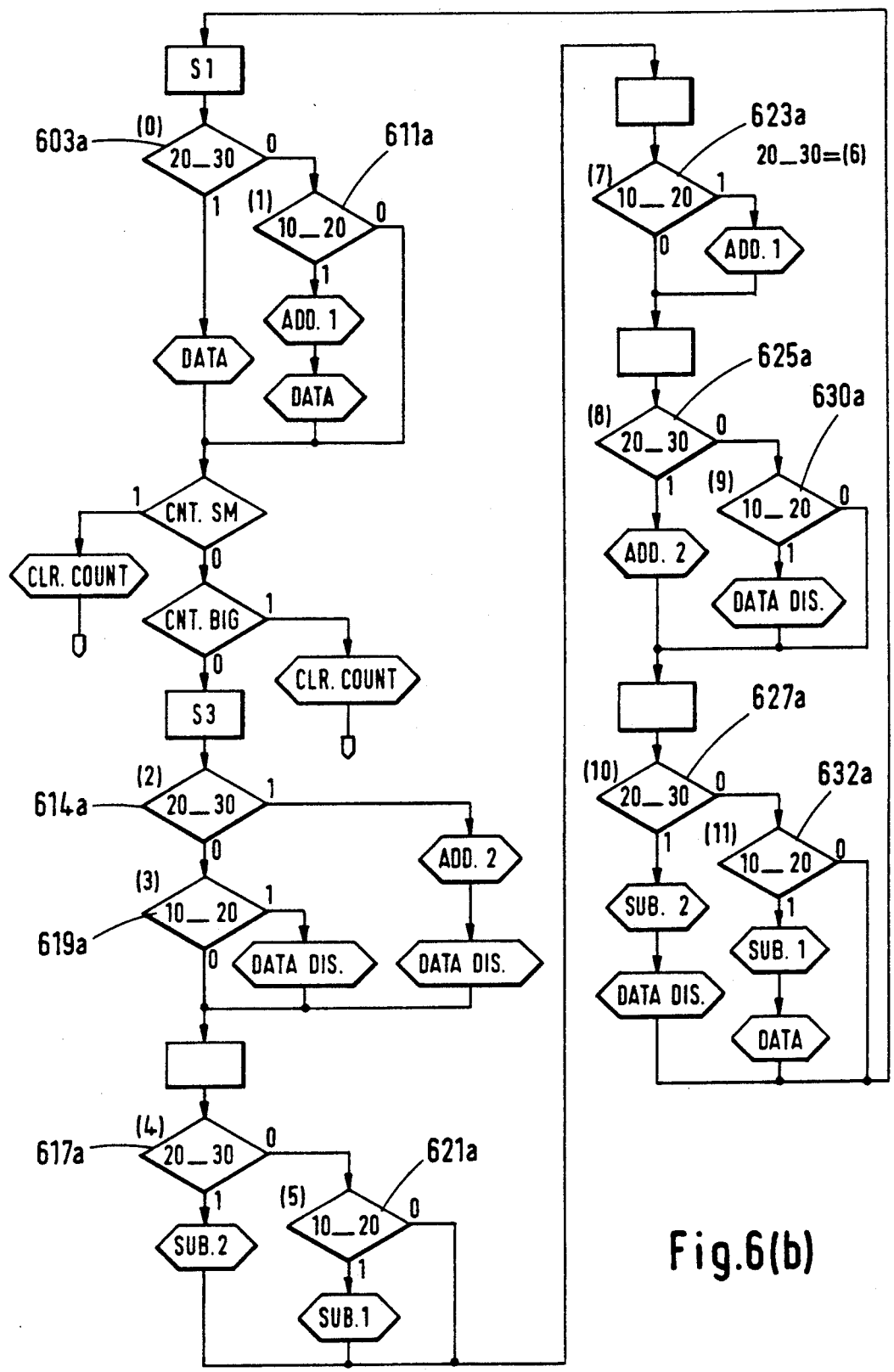

Referring now particularly to FIGS. 6(a) and 6(b), the Figures show the state machine diagram for one of the phase-locked loops, the representation shown in FIG. 6(a) showing the situation occurring when the expected data edge position is in the second half of the sampling clock period and the state machine diagram of FIG. 6(b) showing the situation occurring when the expected data edge position occurs in the first half of the sample clock period. The phase-locked loop begins in the idle state 601 and the first edge to occur is assumed to represent the correct sampling period for data edges and the phase-locked loop begins to start rotating around one of the two loops represented by FIGS. 6(a) and 6(b). Edges are processed as shown in the diagrams whereby, from step 601, at step 602 the counter is reset to its intermediate (normally median) value whenever the phase-locked loop is idle or it is switching between loops. Position 603 is a decision box representative of sampling period 0 of FIG. 4 and is indicative of a data edge occurring in the second half of the sampling clock period. If an edge is present in the second half of the previous clock cycle then a high level "1" output is applied to data detect line active box 604. If no edge is detected at step 603 then the absence or presence of a data edge is detected at the first half of the sample clock period, as indicated by step 605, the step 605 also occurring in the sampling period 0 of FIG. 4. If no edge is detected at step 605 then the state reverts to the idling step 601. If an edge is present at step 605 then output is provided to the data detect line active box 606 and the sequence moves to position S3 shown in FIG. 6(b).

From the data detect line active box 604, whether the count in the counter is too small (box 607) or too big (box 608) is determined. Thus, if the counter has a median value of 32, a maximum value of 48 is signalled by the count being big and box 608 becoming active, and a minimum value of 16 is signalled by the count being small and box 607 going active. If box 607 goes active the counter is reset to its median value at step 609, or if the count is too big, denoted by box 608 going active, then the counter is again reset to its median value at step 610 and the If neither count small (box 607) or count big (box 608) go active then the sequence steps to S2 to wait for the next clock pulse. At the next clock pulse, which then occurs at sample period 1 of FIG. 4, the decision at box 611 is made whether or not a data edge was present in the first half of the sample clock period and if a data edge is present a 1 is added to the count of the counter at step 612 whereupon the data line active output is made at box 613. If no edge is detected at box 611 then the sequence moves to the second sampling clock period 2 of FIG. 4 indicated by box 614. If an edge occurs in the second half of sample 614 then a 2 is added to the counter at step 615 and a data disable signal is output to the other phase-locked loop by box 616. Output from boxes 613 and 616, and the absence of an edge in sample 2 (614), moves the sequence to step S4 and sample period 4 is reviewed. If an edge is detected in sample 4 (box 617) then the count of the counter is subtracted by 2 at step 618 then the sequence moves to step S6. If no edge is detected the sample period 4 then it is determined if an edge is present in the third sample period (619) and if no edge is detected then the procedure steps to step S6, but if an edge is present then at step 620 a data disable signal is applied to the other phase-locked loop.

At step S6 it is determined whether in the sample period 5 (box 621) whether or not an edge is present in the second half of the sample period 5 of FIG. 4. If an edge is present then a 1 is subtracted from the counter at step 622, but if an edge is not present then the sequence moves to step S8. The sample period 6 of FIG. 4 is not present in the diagram of FIG. 6(a) (or FIG. 6(b)) since this sample period is where non-data edges are expected, but if sample periods other than 12 are taken then the detection of edges in the first half of the sample period 6 would be made if the output from box 621 were not active.

At step S8 the sample period 7 of FIG. 4 is reviewed and if an edge is detected in sample period 7 (denoted by box 623) then a 1 is added at step 624 to the counter and the sequence moves to step S10. If, however, no edge is detected at step 623 then the sequence moves to consider whether a data edge is present in sample period 8 of FIG. 4, which is denoted by box 625 in FIG. 6(a). If no edge is detected at step 625 then the sequence moves to step S10, but if an edge is detected then a 2 is added to the count of the counter at step 626. At step S10 the tenth sample is reviewed to determine if an edge is present (box 627) and if such an edge is present then a 2 is subtracted from the count of the counter at step 628 and a data disable signal is sent at step 629 to the other phase-locked loop. If no data edge is detected at step 627 then it is determined whether an edge is present in the sample period 9, as denoted by the box 630. If a data edge is detected then a data disable signal is transmitted to the other phase-locked loop at step 631, but if an edge is not present then, similarly with the outputs of boxes 629 and 631, the sequence returns to step S0. At step S0 it is determined whether the sample period 0 (denoted by box 603') has an edge present which will inherently be a data edge and if it has then the sequence moves to the data detect line active box 604, but if no edge is present then it is determined if an edge is present in sample period 11 (box 632). If no edge is present then the sequence moves to step 607, but if an edge is present then the count of the counter is subtracted by 1 (step 633) whereupon the data detect line is made active at step 634 and the sequence, again, moves to step 607.

It will, thus, be noted that if an edge is one sample period from its expected position then a value of 1 is added or subtracted from the count of the counter and if an edge is two sample periods from its expected position then a 2 is added or subtracted from the count of the counter. When an output is made from the data disable boxes 616, 620, 629 and 631 then the other phase-locked loop is disabled for the next two sampling periods to prevent it from producing a data detect output.

Referring now to FIG. 6(b), if the count of the counter is too big (608) or too small (607), or if from the idle state (601) the first edge is in the first half of the sample clock period (605) then the loop of FIG. 6(b) is traversed and the edges detected at steps 603a, 611a, 614a, 617a, 619a, 621a, 623a, 625a, 630a, 627a and 632a are edges in the other half of the sampling bit period to that detected by the detection steps 603, 611, 614, 617, 619, 621, 623, 625, 627, 630, 632 of FIG. 6(a).

Because the machine state diagram of FIG. 6(b) is similar to that shown in FIG. 6(a), it is not thought that explicit description is required save for that where ADD.1 or ADD.2 is denoted in a box then the count of the counter is incremented by 1, and where SUB.1 or SUB.2 is indicated in a box then the counter is decremented by 1 or 2. The boxes labelled DATA mean that the data detect line is set active (as in FIG. 6(a)) and the maximum count in the counter is denoted by CNT.BIG going active and a minimum value of the counter is signalled by CNT.SML going active. CLR.COUNT causes the counter to be reset to its intermediate value whenever the phase-locked loop is idle or it is switching between loops and the DATA.DIS block means that both data detect line 14, 15 and the disable data line to the other phase-locked loop are set active for the next two generating periods to prevent it from generating a data detect output, all of these conditions being as described above in relation to FIG. 6(a).

The clock and data recovery circuit detects data high (1) and data low (0) signals from the phase-locked loops and uses them to regenerate the transmitted data in NRZ format and a clock with which the data can be sampled. The data signal is recovered using a set/reset arrangement in which the data valid signal from the positive edge triggered phase-locked loop sets the decoded data signal and the same signal from the negative edge triggered phase-locked loop resets the decoded data signal. Such an arrangement, therefore, provides the required NRZ received data.

The clock is recovered by detecting whenever one of the data valid signals has gone active. When this occurs the clock signal is set active some time after the change in the NRZ data so as to provide a data setup time before the clock goes active, for example to a logic 1. The clock signal is then set inactive, ready for the next time one of the data valid signals goes active. The active edges in the clock can then be used to sample the decoded data.

Although not necessary in this invention, a fast lock circuit may be implemented if the above noted method of ignoring a portion of the preamble was not suitable. Because in the preamble sequence of alternating 1's and 0's, every edge is a data edge (see FIGS. 2(a) and 2(b)) then data edges can be detected in every sample period within each bit except sample 6 where no decision can be made since it is equidistant from the expected edge position 0. Thus, the danger of a large amount of variation in the position of the first few edges in the received waveform causing the data edges to move outside of the set of sample periods in which they will be detected is eliminated, provided their position does not shift by more than half a period of the received data. It would also be possible to either increase the amount added or decrement it from the counter for edges away from their expected position, or reduce the counter maximum and minimum predetermined limits in which the phase-locked loop will change its expected edge position, or perform both of these acts, to reduce the time taken by the phase-locked loop to achieve lock. It is to be noted that the fast lock mode, mentioned herein, would have to be disabled and normal operation commenced before the end of the preamble data.

I claim:

1. A receiving apparatus for synchronising a digital data clock in a receiver with a digital data clock in a transmitter, said receiver being for receiving encoded data formed by a plurality of bits, each said bit having a predetermined period, said receiver including means for detecting positive and negative going edges of said encoded data and to provide positive and negative edge detection signals indicative thereof, a first phase locked loop for receiving said positive edge detection signals, a second phase locked loop for receiving said negative edge detection signals, said first and second phase locked loops including means for determining whether an edge is in substantially the middle of a bit period indicative of a data edge or an edge at the end of a bit period indicative of a non-data edge, and clock and data recovery means connected to receive an output signal indicative of a data edge from said first and second phase locked loops respectively, said recovery means reproducing said transmitted data bits in dependence upon output signals from the first and second phase locked loops, whereby an output signal from said first phase locked loop indicates to said recovery means a logical "1" was transmitted and an output signal from said second phase locked loop indicates to said recovery means a logical "0" was transmitted.

2. A method of synchronising a digital data clock in a receiver with a digital data clock in a transmitter, said receiver receiving encoded data formed by a plurality of bits, each said bit having a predetermined period, said receiver operation including the steps of detecting positive and negative going edges of the received encoded data and providing positive and negative edge detection signals indicative thereof, receiving said positive edge detection signals in a first phase locked loop, receiving said negative edge detection signals in a second phase locked loop, said first and second phase locked loops determining whether an edge is in substantially the middle of a bit period indicative of a non-data edge, and recovering an output signal indicative of a data edge from said first and second phase locked loops respectively to reproduce said transmitted data bits in dependence upon output signals of each of the first and second phase locked loops, an output signal from said first phase locked loop indicating a logical "1" was transmitted and an output signal from said second phase locked loop indicating a logical "0" was transmitted.

3. A method as claimed in claim 2 wherein said received data comprises encoded data with a period of one half the bit period of transmitted data and a data edge at approximately the middle of each transmitted data period and each phase locked loop has a counter means for maintaining lock on said data such that when a data or a non-data edge occurs the phase locked loop compares the actual edge position with the expected position of the edge and if the edge is later than expected the counter associated with said phase locked loop is incremented and if the edge is earlier than expected the counter associated with said phase locked loop is decremented.

4. A method as claimed in claim 3 wherein if the count of the counter means reaches a predetermined maximum value or a predetermined minimum value, then the sampling period where data and non-data edges are expected is advanced or retarded respectively by one sample.

5. A method as claimed in claim 4 wherein when a data edge is detected by one of the first and second phase locked loops then a disable signal is sent to the other of said first and second phase locked loops to prevent said other of said first and second phase locked loops detecting a data edge.

6. A method as claimed in claim 2 wherein received encoded data includes a preamble portion of data bits and the first and second phase locked loops are arranged to ignore a first predetermined number of bits of said preamble portion, said predetermined number of bits being dependent upon when the received signal jitter is substantially constant.

7. A method as claimed in claim 6 wherein said preamble portion of data bits is such that every edge is a data edge and means are provided for sampling each said bit at a predetermined rate after detecting said data edge.

8. A method as claimed in claim 7 wherein said predetermined rate of sampling n is four or a multiple thereof, and at sampling period n/4 and 3n/4 if an edge is detected as a data edge by one of the first and second phase locked loops then a data valid signal is sent from the detecting phase locked loop to a clock and data recovery means but no change is made to the count of the detecting phase locked loop counter means, and a data disable signal is transmitted from the detecting phase locked loop to the other phase locked loop for preventing said other phase locked loop from generating a data valid signal for a predetermined number of sampling periods.

9. A method as claimed in claim 8 wherein the clock and data recovery means recovers the data signal using a set/reset arrangement in which the data valid signal from the positive edge triggered phase locked loop sets the decoded data signal and the data valid signal from the negative edge triggered phase locked loop resets the decoded data signal whereby non-return to zero (NRZ) received data is produced.

10. A method as claimed in claim 9 wherein the clock and data recovery means recovers the clock data by detecting whenever one of the data valid signals becomes active, the clock signal being set active at a predetermined time after the change in the NRZ data and thereafter the clock signal is set inactive ready for the next time one of the data valid signals goes active, whereby the active edges in the clock signal are used to sample the decoded data.

11. A method as claimed in claim 2 wherein said received encoded data is Manchester encoded.

* * * * *